US006930055B1

(12) United States Patent
Bhowmik et al.

(10) Patent No.: US 6,930,055 B1
(45) Date of Patent: Aug. 16, 2005

(54) SUBSTRATES HAVING FEATURES FORMED THEREIN AND METHODS OF FORMING (75) Inventors: Siddhartha Bhowmik, Salem, OR (US); Rio T. Rivas, Corvallis, OR (US); Mark C. Huth, Corvallis, OR (US); Rocky H. Knuth, Lebanon, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 4 days.

(21) Appl. No.: 10/855,113

(22) Filed: May 26, 2004

(51) Int. Cl.[7] ............................................ H01L 21/302

(52) U.S. Cl. ..................................................... 438/745

(58) Field of Search ................................ 438/749, 719, 438/745, 109, 107, 52, 39; 347/63, 65; 216/12; 29/611; 257/99, 79

(56) References Cited

U.S. PATENT DOCUMENTS

| | | |
|---|---|---|
| 6,402,301 B1 | 6/2002 | Powers et al. |
| 6,554,403 B1 | 4/2003 | Chen et al. |
| 6,555,480 B2 | 4/2003 | Milligan et al. |
| 2003/0027426 A1 | 2/2003 | Milligan et al. |
| 2003/0142185 A1 | 7/2003 | Donaldson et al. |
| 2004/0055145 A1 * | 3/2004 | Buswell ........................ 29/611 |

* cited by examiner

Primary Examiner—Craig A. Thompson
Assistant Examiner—Monica D. Harrison (57) ABSTRACT The described embodiments relate to substrates having features formed therein and methods of forming same. One exemplary method forms a blind feature through a majority of a thickness of a substrate, the blind feature being defined by at least one sidewall surface and a bottom surface. The method also applies an etch resistant material to the blind feature and removes the etch resistant material from at least a portion of the bottom surface. The method further wet etches the substrate at least through the bottom surface sufficient to form a through feature through the thickness of the substrate.

27 Claims, 14 Drawing Sheets

SUBSTRATES HAVING FEATURES FORMED THEREIN AND METHODS OF FORMING

BACKGROUND

Micro electro mechanical systems devices such as fluid-ejecting devices are employed in various capacities including print cartridges. Many micro electro mechanical systems devices utilize substrates having slots formed therein. Slots can be formed utilizing various suitable substrate removal techniques. Different substrate removal techniques have different attributes such as substrate removal rates, slot shapes which can be formed with the technique, and controllability of the technique, among others. Improved slots and/or processing parameters can be achieved by utilizing a combination of substrate removal processing techniques to take advantage of these attributes.

BRIEF DESCRIPTION OF THE DRAWINGS

The same components are used throughout the drawings to reference like features and components wherever feasible. Alphabetic suffixes are utilized to designate different embodiments. The various components described below may not be illustrated to scale. Rather, the included figures are intended as diagrammatic representations to illustrate to the reader various inventive principles that are described herein.

DETAILED DESCRIPTION OF THE PREFERRED EMBODIMENTS

The embodiments described below pertain to methods and systems for forming through features, such as slots, in a substrate. Several embodiments are provided below where the slots comprise fluid-handling slots. Slots also can be formed in substrates utilized in many other applications.

Through features, such as slots, can be formed with a first substrate removal process and then a second substrate removal processes. Each of the substrate removal processes can be selected based upon characteristics of that particular removal process. In one implementation, a first substrate removal technique can be selected from, among other criteria, its rate of substrate removal and its ability to form slot sidewalls having a desired configuration. A protective material can be selectively applied to some surfaces of the substrate to protect those surfaces from a second substrate removal process. The second substrate removal process can be selected, at least in part, on its selective removal characteristics.

Exemplary Printing Device

Figure 1:
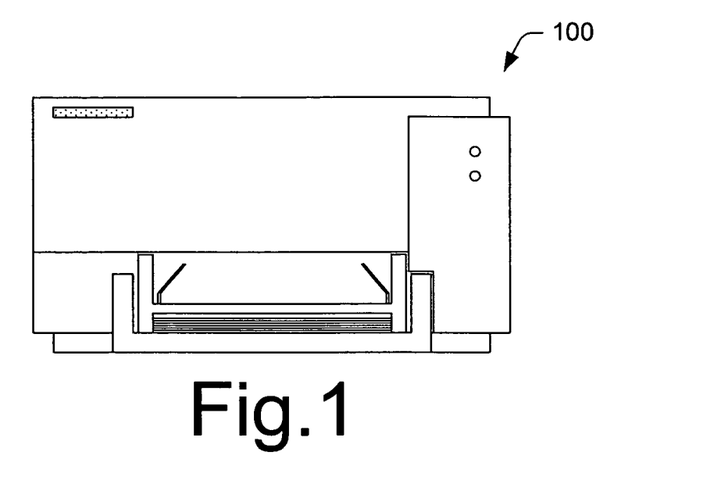
FIG. 1 illustrates a front elevational view of a diagrammatic representation of an exemplary printer in accordance with one embodiment.

FIG. 1 illustrates a diagrammatic representation of an exemplary printing device that can utilize an exemplary print cartridge. In this embodiment the printing device comprises a printer 100. The printer shown here is embodied in the form of an inkjet printer. The printer 100 can be capable of printing in black-and-white and/or color. The term "printing device" refers to any type of printing device and/or image forming device that employs slotted substrate(s) to achieve at least a portion of its functionality. Examples of such printing devices can include, but are not limited to, printers, facsimile machines, and photocopiers. In this exemplary printing device the slotted substrates comprise a portion of a print head which is incorporated into a print cartridge, an example of which is described below.

Beyond the printing arena, exemplary substrates having slots formed therein can be incorporated into various micro electro mechanical systems (MEMS) devices. Exemplary MEMS devices can comprise fluid-ejecting devices which are utilized in medical and laboratory applications among others. Exemplary substrates also can be utilized in various other applications. Other examples of exemplary MEMs devices can include display devices employing a slotted substrate to create a visual display.

Exemplary Products and Methods

Figure 2:
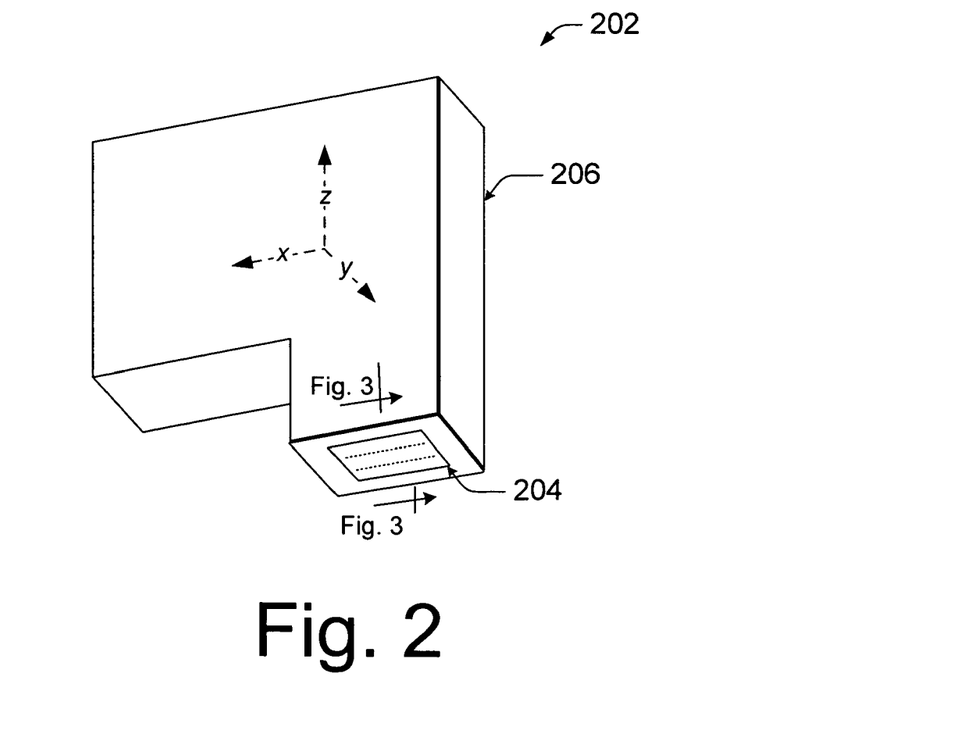
FIG. 2 illustrates a perspective view of a diagrammatic representation of a print cartridge suitable for use in the exemplary printer shown in FIG. 1 in accordance with one embodiment.

FIG. 2 shows a diagrammatic representation of an exemplary print cartridge 202 that can be utilized in an exemplary printing device. In this particular configuration the print cartridge is comprised of a print head 204 and a cartridge body 206 that supports the print head. Though a single print head 204 is employed on this print cartridge 202 other exemplary configurations may employ multiple print heads on a single cartridge.

Print cartridge 202 is configured to have a self-contained fluid or ink supply within cartridge body 206. Other print cartridge configurations alternatively or additionally may be configured to receive fluid from an external supply. Other exemplary configurations will be recognized by those of skill in the art.

Figure 3:
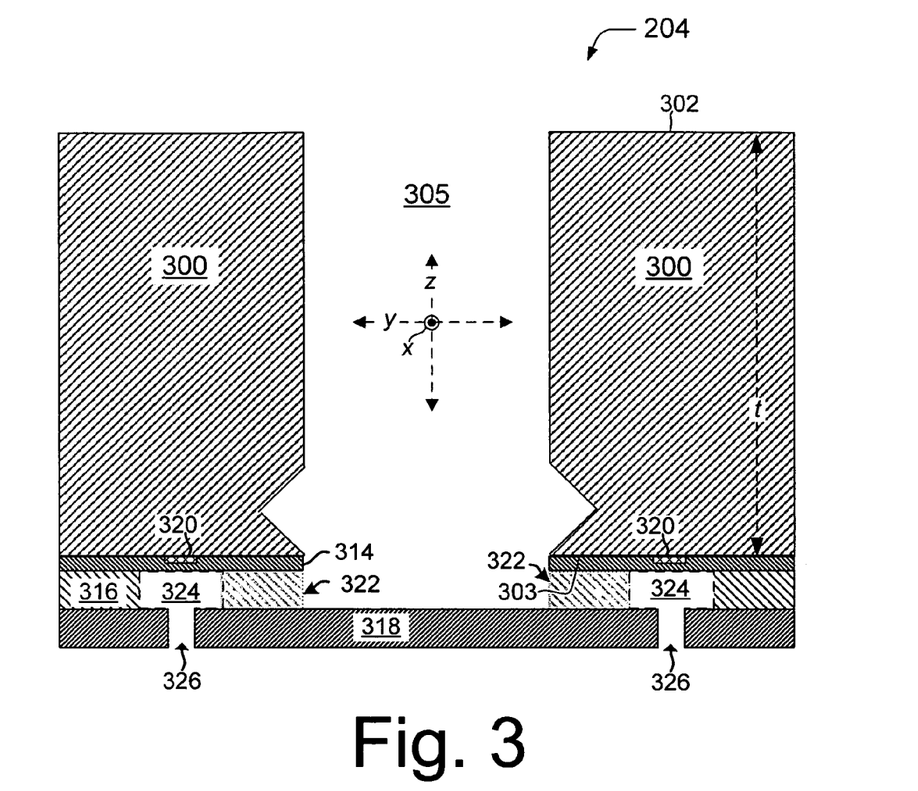
FIG. 3 illustrates a diagrammatic representation of a side-sectional view of a portion of the print cartridge shown in FIG. 2 in accordance with one embodiment.

FIG. 3 shows a side-sectional diagrammatic representation of a portion of the exemplary print head 204 as indicated in FIG. 2. The view of FIG. 3 is taken transverse an x-axis of a fluid-feed slot (described below), the axis extending into and out of the plane of the page upon which FIG. 3 appears. Here a substrate 300 has a thickness t which extends between a first substrate surface ("first surface") 302 and a second substrate surface ("second surface") 303. A through feature or slot 305 passes through substrate 300 between first and second surfaces 302, 303.

In this particular embodiment, substrate 300 comprises silicon which either can be doped or undoped. Further, in this particular embodiment, substrate 300 is what is referred to as <100> silicon where the designation relates to the molecular orientation of the silicon molecules. Other embodiments may utilize <110> and/or <111> silicon. Other substrate materials can include, but are not limited to, gallium arsenide, gallium phosphide, indium phosphide, glass, quartz or other material.

Substrate thickness t can have any suitable dimensions that are appropriate for an intended application. In some embodiments substrate thicknesses t can range from less than 100 microns to more than 2000 microns. One exemplary embodiment can utilize a substrate that is approximately 675 microns thick. Though a single substrate is discussed herein, other suitable embodiments may comprise a substrate that has multiple components during assembly and/or in the finished product. For example, one such embodiment may employ a substrate having a first component and a second sacrificial component which is discarded at some point during processing.

In this particular embodiment, one or more layers 314, e.g. thin-film layers, are positioned over substrate's second surface 303. In at least some embodiments a barrier layer 316 and an orifice plate or orifice layer 318 are positioned over the layers 314.

In one embodiment one or more layers 314 can comprise one or more conductive traces (not shown) and electrical components such as resistors 320. Individual resistors can be controlled selectively via the electrical traces. Layers 314 also can define in some embodiments, at least in part, a wall or surface of multiple fluid-feed passageways 322 through which fluid can pass. Layers 314 also can comprise among others, a field or thermal oxide layer. Barrier layer 316 can define, at least in part, multiple firing chambers 324. In some embodiments, fluid-feed passageways 322 may be defined in barrier layer 316, alone or in combination with layers 314. Orifice layer 318 can define multiple firing nozzles 326. Individual firing nozzles can be aligned respectively with individual firing chambers 324.

In operation a fluid, such as ink, can enter slot 305 from the cartridge body shown FIG. 2. Fluid then can flow through individual passageways 322 into an individual chamber 324. Fluid can be ejected from the chamber when an electrical current is passed through an individual resistor 320. The electrical current can cause the resistor sufficiently to heat some of the fluid contained in the firing chamber to its boiling point so that it expands to eject a portion of the fluid from a respectively positioned nozzle 326. The ejected fluid then can be replaced by additional fluid from passageway 322.

Figure 4A:
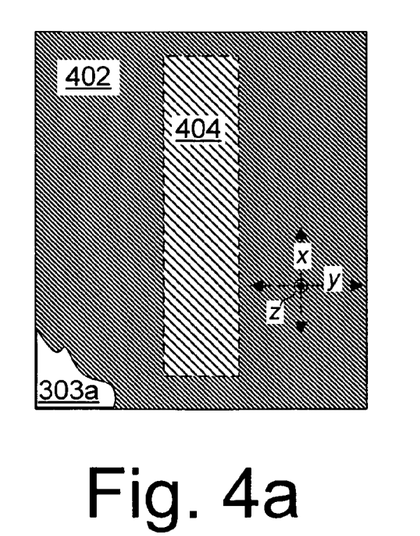
FIGS. 4a–4h illustrate diagrammatic representations of process steps for forming an exemplary slotted substrate in accordance with one embodiment.

FIGS. 4a–4h illustrate diagrammatic representations of process steps for forming an exemplary slotted substrate in accordance with one embodiment. FIG. 4a illustrates a top view of substrate's second surface 303a. FIGS. 4b–4h illustrate side-sectional views of substrate 300a.

Figure 4B:
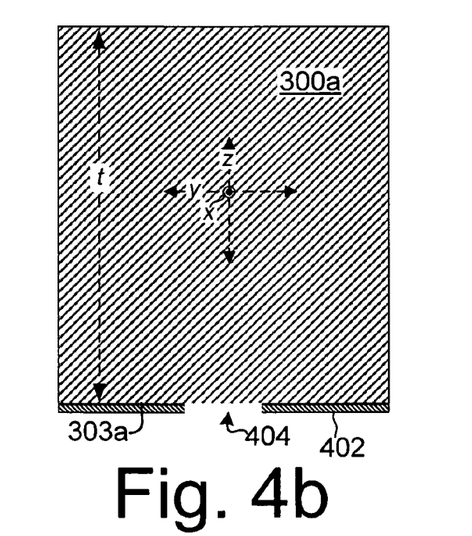

FIGS. 4a–4b illustrate a first etch resistant layer 402 patterned over second surface 303a. In one embodiment, first etch resistant layer 402 comprises various thin-film layers similar to those described in relation to FIG. 3. First etch resistant layer 402 can be patterned to define an opening or footprint 404 that can define the size and relative location of a slot at second surface 303a. The slot can be formed in substrate 300a in the processing steps described below.

It should be noted that while thin-film layers similar to those described in relation to FIG. 3 may be utilized as first etch resistant layer 402, other known materials may be utilized to form first etch resistant layer 402. In such embodiments, thin-film layers, and/or other devices or structures, can be formed after or during formation of features in substrate 300/300a.

Figure 4C:
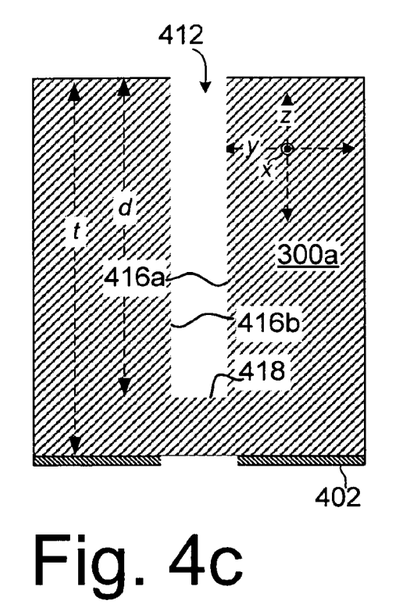

Referring to FIG. 4c, a first substrate removal process is utilized to form a blind feature 412 into substrate 300a. The first substrate removal process can comprise one or more of laser machining, etching, sawing, and abrasive jet machining, among others. In some embodiments, the first substrate removal process forms the blind feature through a majority of a thickness t of the substrate as measured by a depth d. In this particular embodiment, the blind feature passes through about 75% of the thickness t of the substrate. Other embodiments may remove substrate to a depth in the range of 25% to about 99% with the first substrate removal process. Other embodiments may combine multiple substrate removal processes to achieve blind feature 412.

The blind feature can be defined by at least a sidewall surface and a bottom surface. In this illustrated embodiment, blind feature 412 can be defined by a first sidewall surface 416a, a second sidewall surface 416b and a bottom surface 418. In this particular embodiment the sidewall surfaces 416a, 416b are generally orthogonal to first surface 302a while bottom surface 418 is generally parallel to the first surface. In other embodiments the sidewall surfaces may be oblique relative to the first surface. Further, in this illustrated embodiment, bottom surface 418 is generally planar. Other embodiments may have a bottom surface which is irregular or uneven.

Figure 4D:
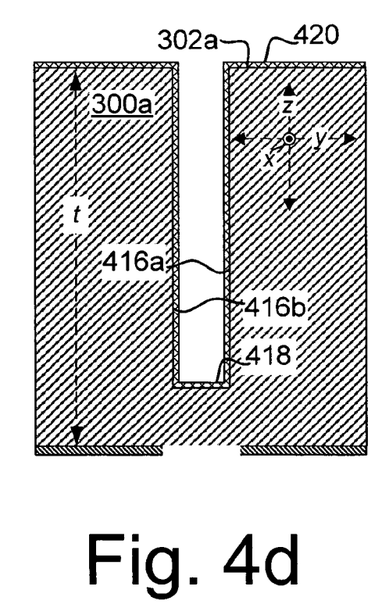

Referring to FIG. 4d, where a second etch resistant material 420 is applied to at least some of the surfaces of substrate 300a including at least portions of sidewall surfaces 416a, 416b. In this particular embodiment, the second etch resistant material comprises a wet etch resistant material. In one embodiment, the second etch resistant material 420 is positioned generally over first surface 302a, the sidewall surfaces 416a, 416b, and the bottom surface 418. Any suitable etch resistant materials can be utilized for the second etch resistant material. Examples include, but are not limited to, doped and undoped silicon oxide, silicon carbide, and silicon nitride. Some such examples are selected for their resistance to wet etchants. The second etch resistant material can be positioned on the substrate utilizing any suitable process. Examples include, but are not limited to chemical vapor deposition, plasma enhanced chemical vapor deposition (PECVD), ionized deposition, and physical vapor deposition.

Figure 4E:
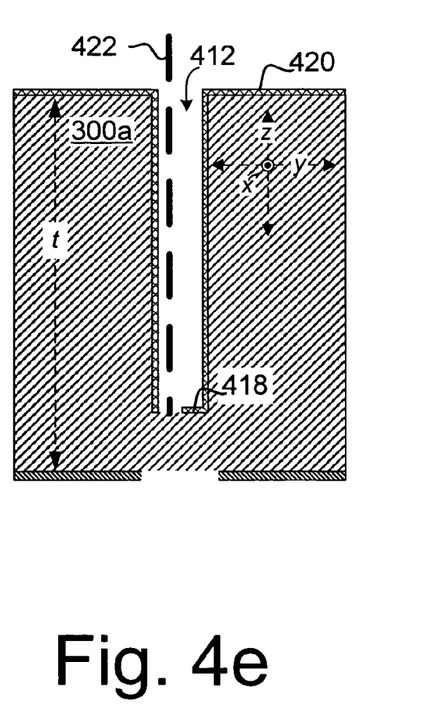
Figure 4F:
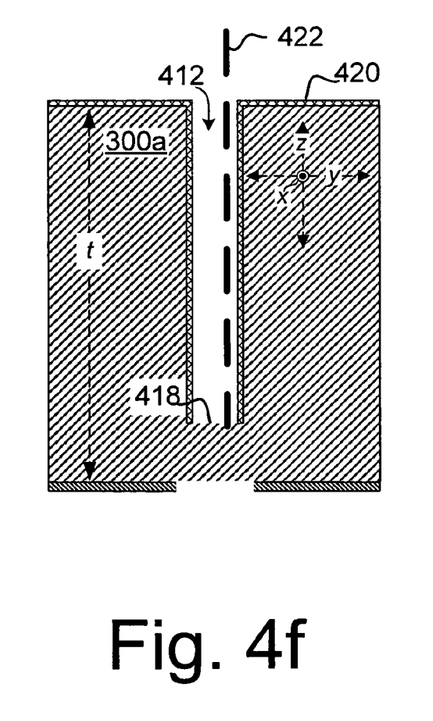

Referring to FIGS. 4e–4f where a subsequent process step removes the second etch resistant material 420 from at least a portion of the bottom surface 418. In this instance the second etch resistant material is removed from essentially the entire bottom surface 418. Other embodiments may remove the second etch resistant material from only portions of the bottom surface. Second etch resistant material 420 can remain on at least portions of sidewalls 416a, 416b. In this illustrated embodiment, sidewalls 416a, 416b remain generally covered by the second etch resistant material 420 after its removal from the bottom surface 418.

Various processes can be utilized to remove second etch resistant material 420. In one embodiment, a laser beam 422 removes the second etch resistant material. The laser beam can be any laser beam capable of removing the second etch resistant material. Such laser beams should be known to those of skill in the art. In this instance the laser beam does not significantly increase the depth d of blind feature 412 though it may in some embodiments. Etch resistant material 420 can be removed also with directional dry etching or ion milling, reactive ion etching (RIE), or a combination of these, among others.

Figure 4G:
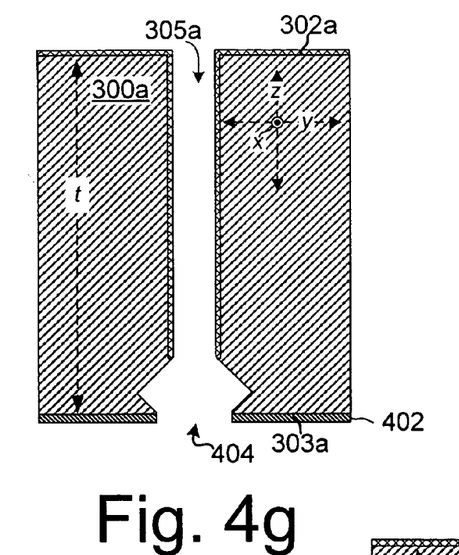

Referring to FIG. 4g, a subsequent process step exposes substrate 300a to a wet etchant to remove additional substrate material. In this particular process, substrate 300a is immersed in the wet etchant such that wet etchant can enter blind feature 412 of FIG. 4f from first surface 302a. The wet etchant also can act upon exposed substrate material of second surface 303a comprising opening 404. The wet etchant can act anisotropically on exposed portions of second surface 303a and on the bottom surface until removing substrate material sufficiently to form a through feature through the substrate's thickness t. In this instance, the through feature comprises slot 305a. Any suitable wet etchant can be utilized. Examples of wet etchants can include, but are not limited to, potassium hydroxide and tetramethyl ammonium hydroxide, among others.

Figure 4H:
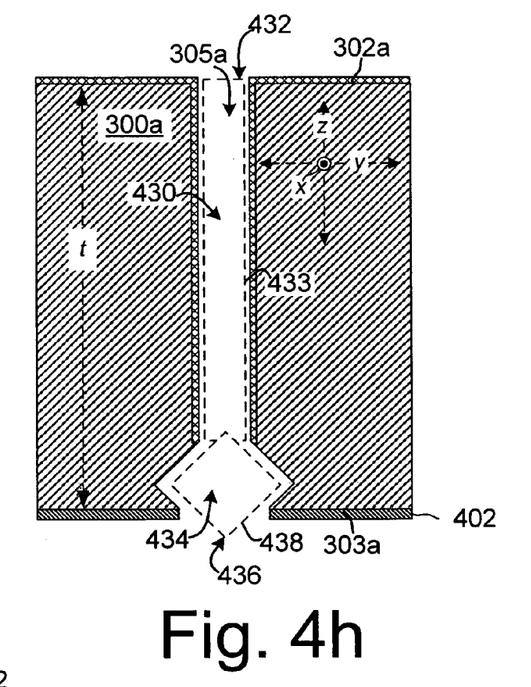

FIG. 4h illustrates another side-sectional view of a profile of substrate 300a and slot 305a. In this particular configuration, slot 305a can be comprised of a first portion 430 which approximates a portion of a first rectangle 432, and a second portion 434 which approximates a portion of a second rectangle 436. In this instance, first rectangle 432 has at least one side 433 which is generally orthogonal to first surface 302a. Second rectangle 436 comprises side 438 which is oriented obliquely relative to first surface 302a.

Figure 4I:
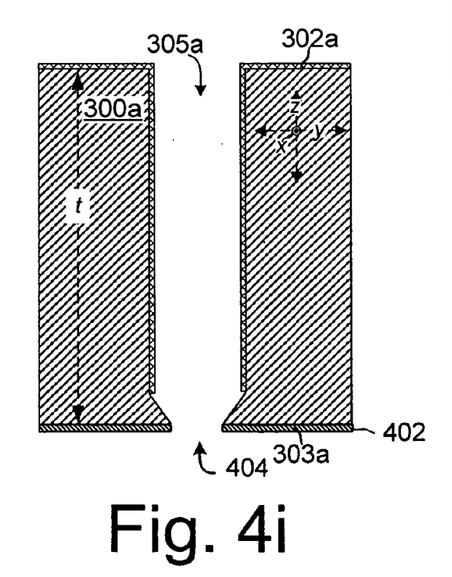
FIG. 4i illustrates a diagrammatic representation of a side-sectional view of another exemplary slotted substrate in accordance with one embodiment.

The embodiment shown in FIGS. 4a–4h provides but one exemplary slot configuration. Those skilled in the art should recognize that various slot configurations can be achieved through selection of various parameters relative to the slotting process. Such parameters can include, but are not limited to, the type of substrate, etchant conditions, relative size and depth of the openings and/or or features. For example, FIG. 4i illustrates another configuration for slot 305a. The skilled artisan should recognize still other configurations.

FIGS. 5a–5i illustrate another exemplary substrate configuration and process steps for forming the substrate.

Figure 5A:
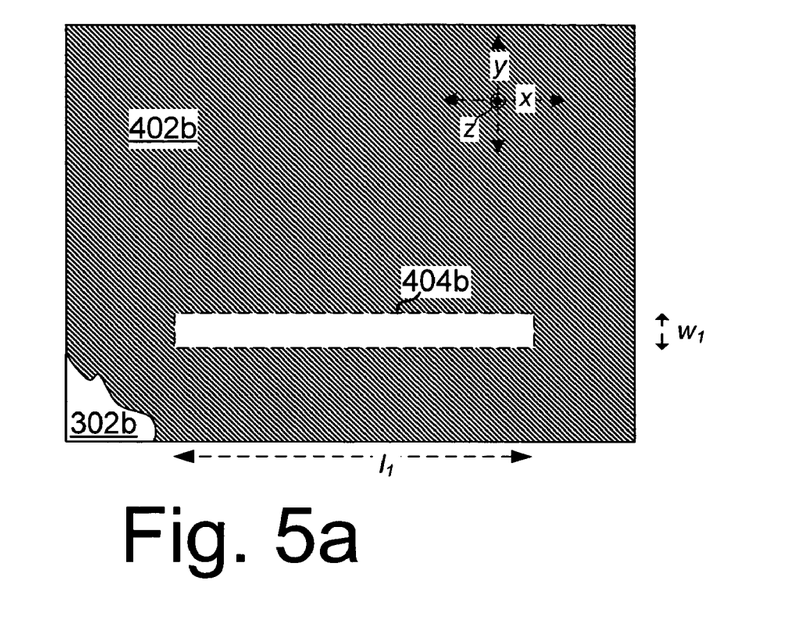
FIGS. 5a–5i illustrate diagrammatic representations of process steps for forming an exemplary slotted substrate in accordance with another embodiment.
Figure 5B:
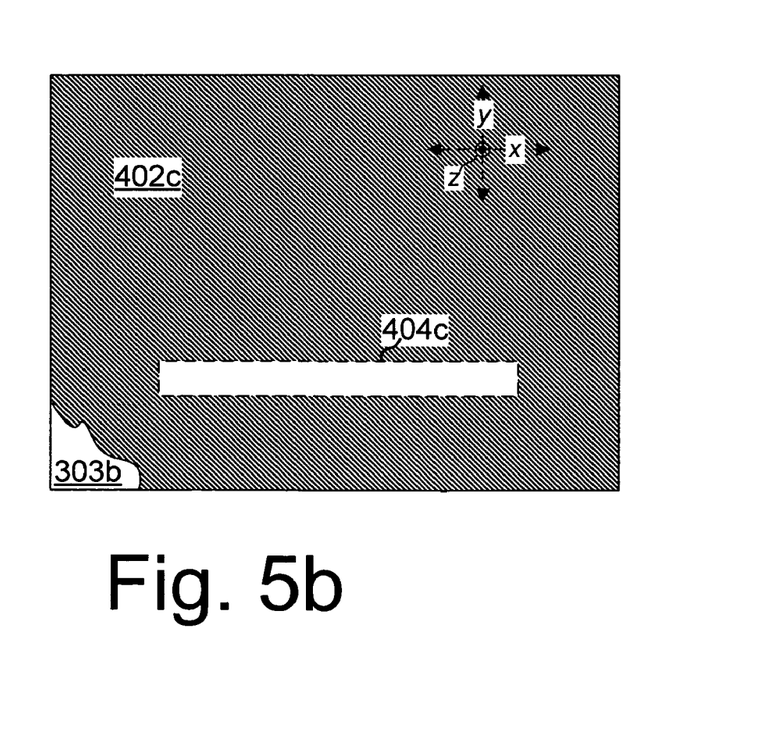

FIGS. 5a–5b illustrate top views of first surface 302b and second surface 303b respectively of another exemplary substrate. Opening 404b is patterned in first etch resistant material 402b positioned over first surface 302b to define a width $w_1$ and a length $l_1$. Opening 404c is patterned in first etch resistant material 402c positioned over second surface 303b. In the embodiment, depicted in FIGS. 5a–5b, opening 404b is generally equivalent in size and relative orientation to opening 404c. Other configurations may utilize openings of differing sizes and/or relative orientations.

It also should be noted that first etch resistant material 402c can be positioned over second surface 303b at other times than immediately after or before first etch resistant material 402b is positioned over first surface 302b.

Figure 5C:
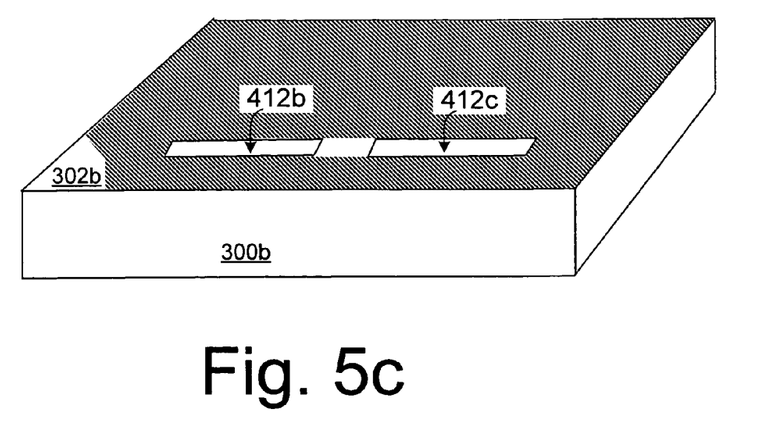
Figure 5D:
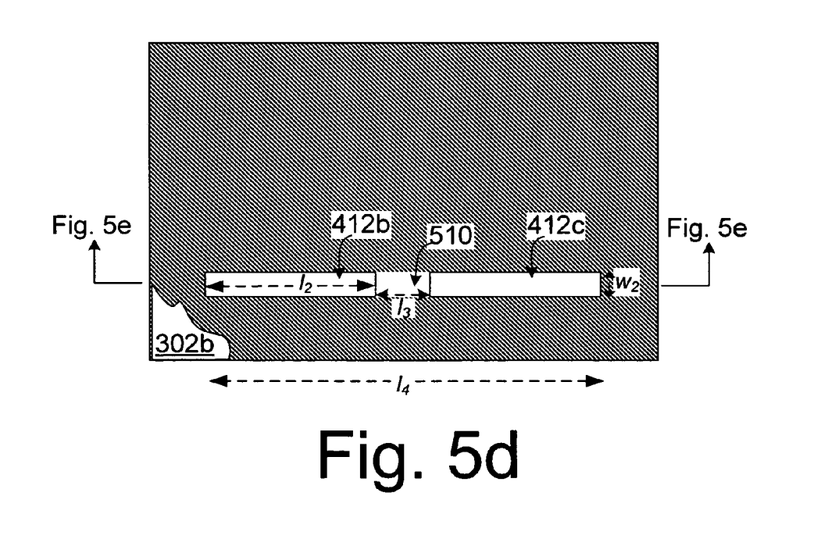
Figure 5E:
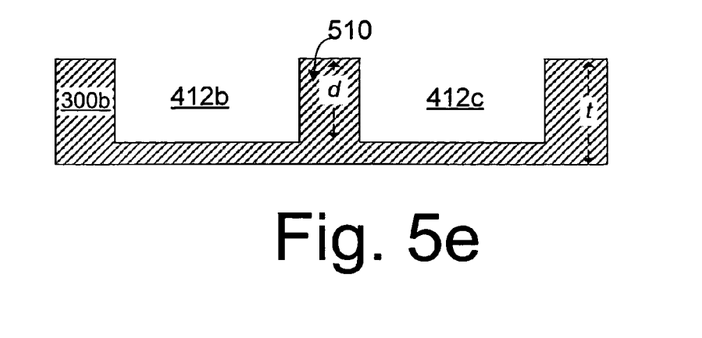

FIG. 5c represents a perspective view of substrate 300b, while FIGS. 5d–5e represent a top view and a cross-sectional view respectively. FIGS. 5c–5e illustrate a plurality of blind features formed in substrate 300b. The blind features are formed through first surface 302b and substantially within an area within substrate 300b that corresponds to opening 404b, illustrated in FIG. 5a. In this instance there are two blind features 412b, 412c. Other embodiments may utilize more blind features as desired, as will become apparent below.

Blind features 412b, 412c can be formed utilizing any suitable substrate removal process, including but not limited to, laser machining, sawing, and etching, among others. The blind features can be formed to a depth d which passes through about 25% to about 99% of the substrate's thickness t. In this illustrated embodiment, depth d is about 90% of thickness t.

In this illustrated configuration, blind features 412b, 412c have a width $w_2$ and a length 12. Width $w_2$ generally corresponds to width $w_1$ of opening 404b, illustrated in FIG. 5a. Individual blind features are separated by substrate material 510 having a length $l_3$, which in one embodiment is in a range of about less than 100 microns to about 50 millimeters with length $l_3$ comprising about 1 millimeter as illustrated here.

In addition, depth d can be such that a height of substrate material 510 is below first surface 302b of substrate 300b.

Blind features 412b, 412c are arranged generally linearly along the x-axis which is provided for purposes of explanation. The blind features cumulatively define an overall or outside-to-outside length $l_4$ which generally corresponds to the opening's length $l_1$, illustrated in FIG. 5a. Although the blind features illustrated here are arranged generally linearly, other blind features can be arranged in other configurations to achieve a slot configuration as will become evident below. The individual blind features in some embodiments may have a length $l_2$ in a range of about less than 1 millimeter to about 50 millimeters or more.

Figure 5F:
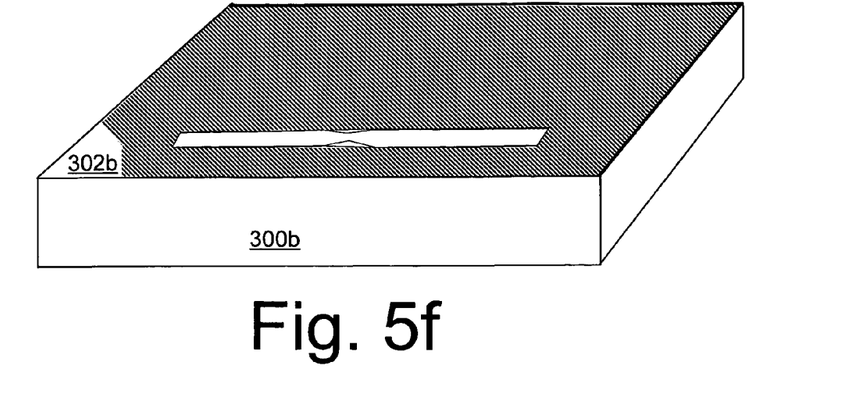
Figure 5G:
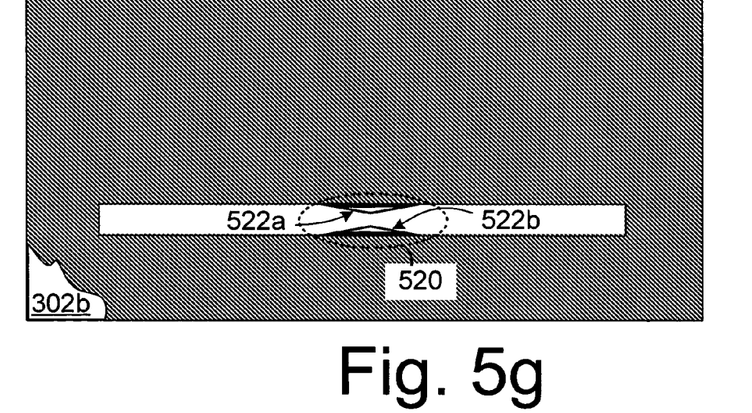
Figure 5H:
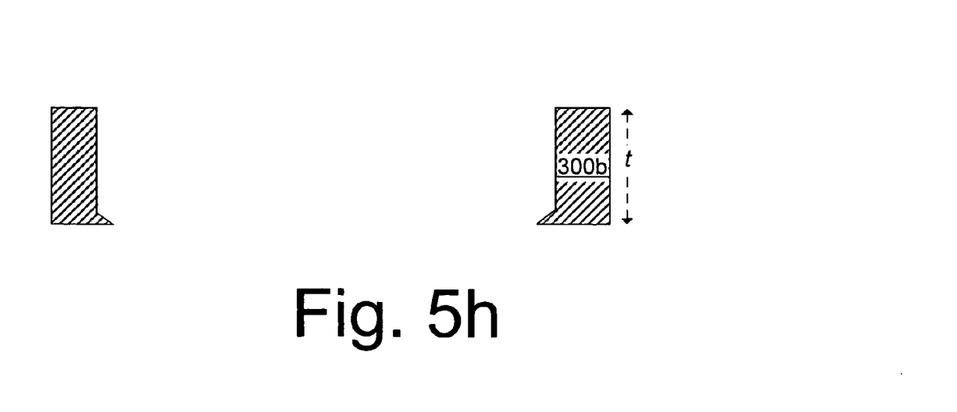
Figure 5I:
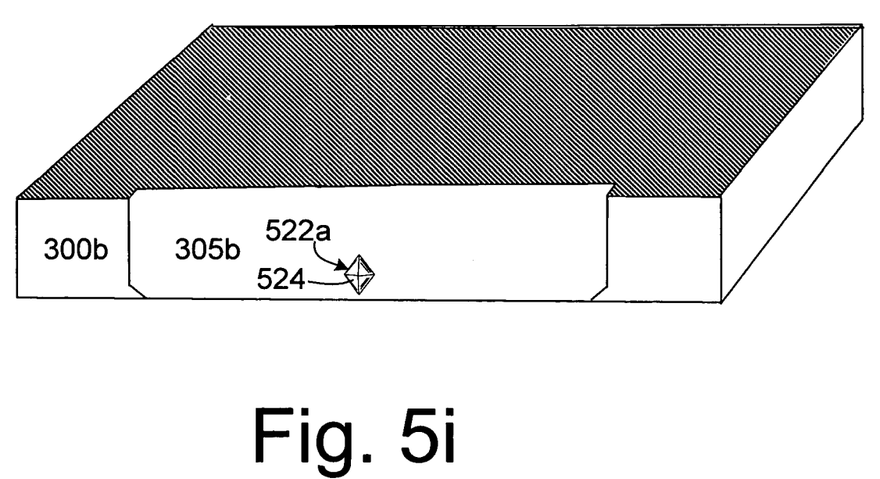

FIGS. 5f–5h illustrate similar views as those illustrated in FIGS. 5c–5e respectively. FIG. 5i illustrates a cut-away perspective view of substrate 300b through slot 305b. In one embodiment, substrate 300b is exposed to a wet etchant. In this instance the wet etchant is allowed to act upon the substrate sufficiently to fluidly connect adjacent blind features and to form a through feature through the substrate's thickness t. In this embodiment, the through feature can comprise a generally elongate slot 305b that has a length which generally approximates an overall length $l_1$ of the blind features as measured along the x-axis. Slot 305b can have dimensions at the first and second surfaces 302b, 303b that generally are defined by openings 404b, 404c.

In some embodiments, upon completion of the etching process, the feature can be defined, at least in part, by at least one pair of structures in the substrate indicated generally at 520. In this embodiment the pair of structures comprise co-tapering constriction structures 522a, 522b. The constriction structures 522a, 522b are spaced from one another and are generally opposing. In this particular embodiment each constriction structure comprises one or more faceted surfaces 524. Among other origins, constriction structures 522a, 522b may comprise residual substrate material from substrate material 510 described above in relation to FIGS. 5c–5e. The exemplary constriction structure configuration illustrated in FIGS. 5g and 5i is but one possible configuration. Various factors can contribute to producing and to affecting the configuration of the constriction structures. Such factors can include, but are not limited to, the relative depth of the blind features, the distance between the blind features, the conditions during etching, the duration of the etch process, the crystal plane orientation of the substrate if the substrate is crystalline, and the composition and molecular organization of the substrate, among other factors.

Figure 6A:
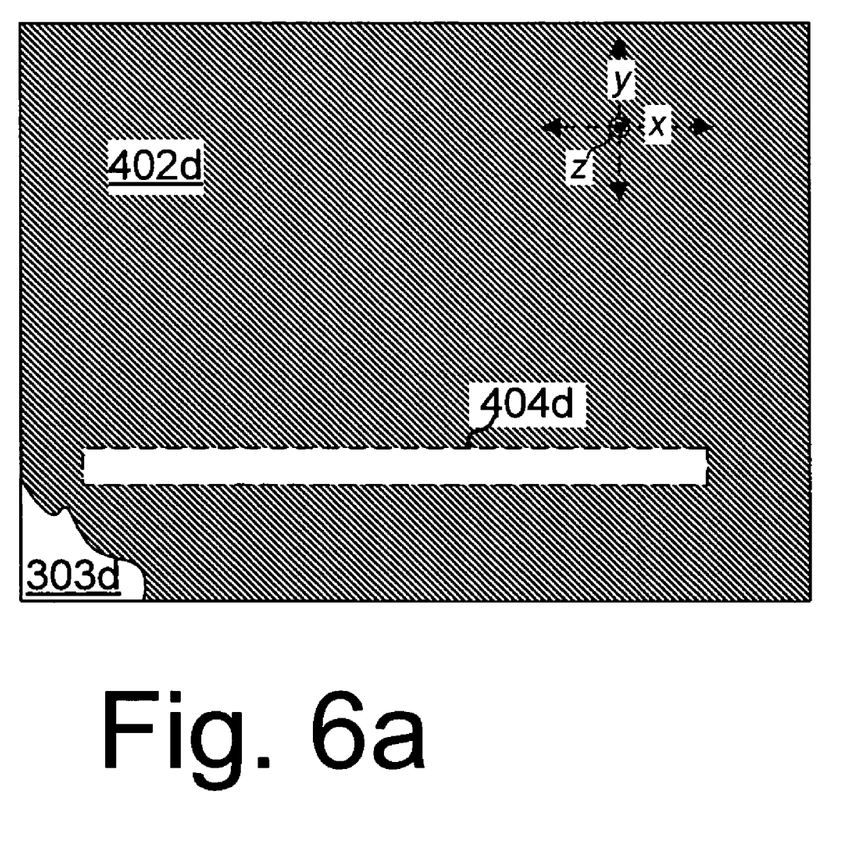
FIGS. 6a–6j illustrate diagrammatic representations of process steps for forming an exemplary slotted substrate in accordance with another embodiment.
Figures 6B, 6C:
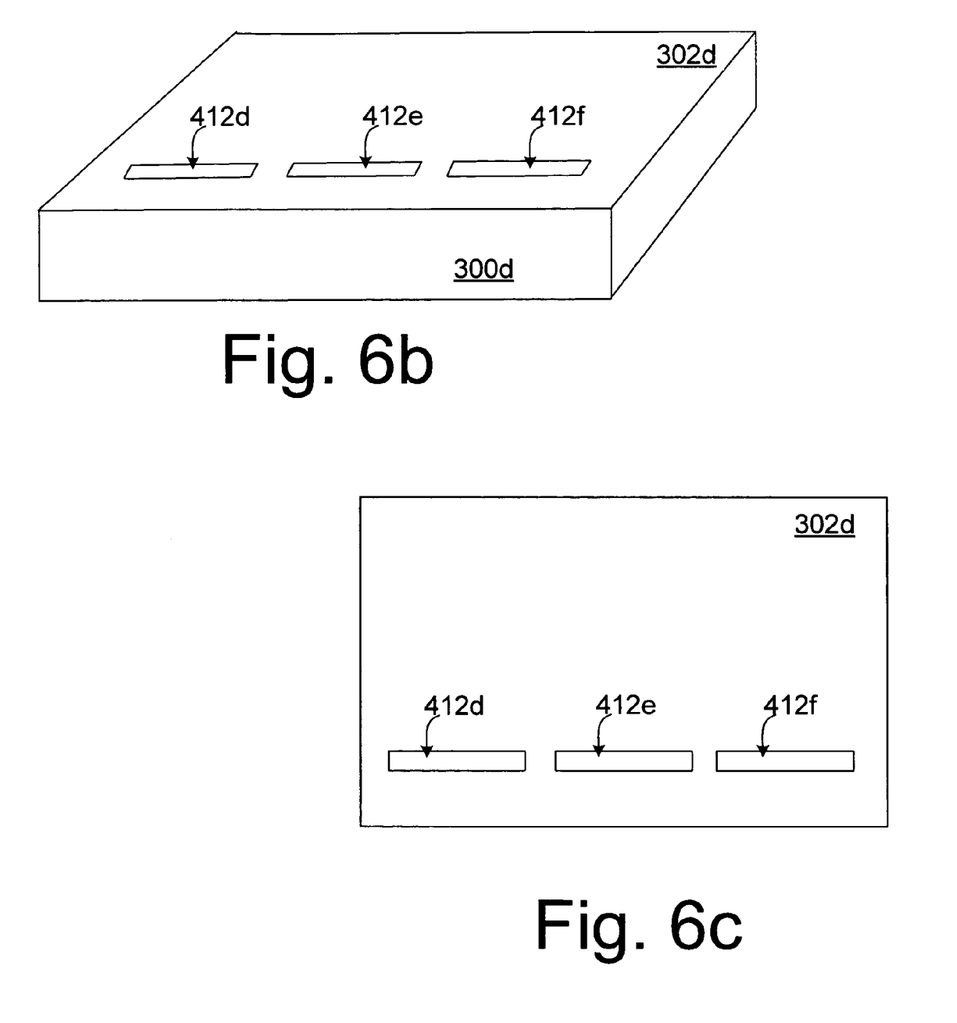
Figure 6D:
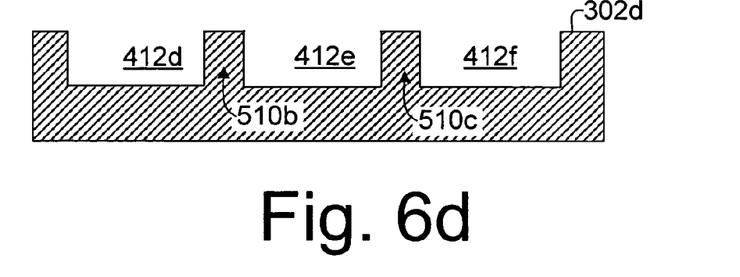
Figure 6E:
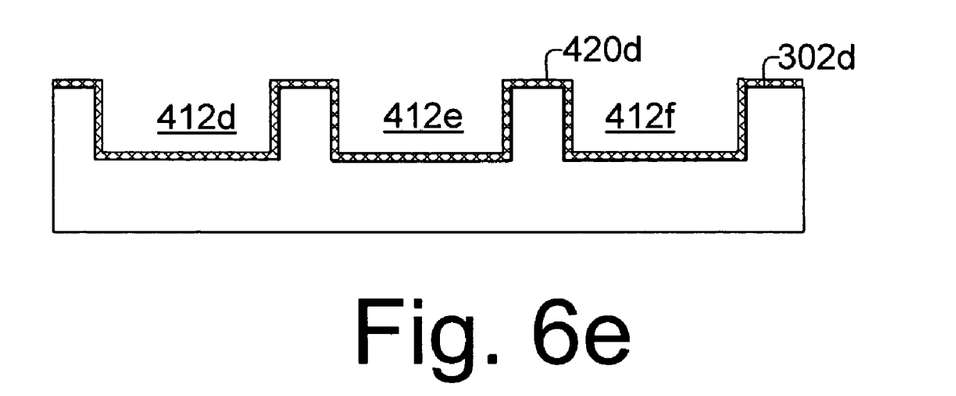
Figure 6F:
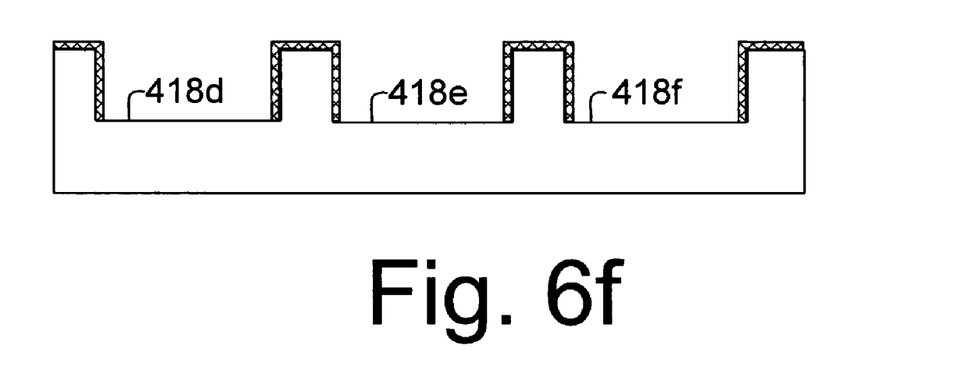
Figure 6G:
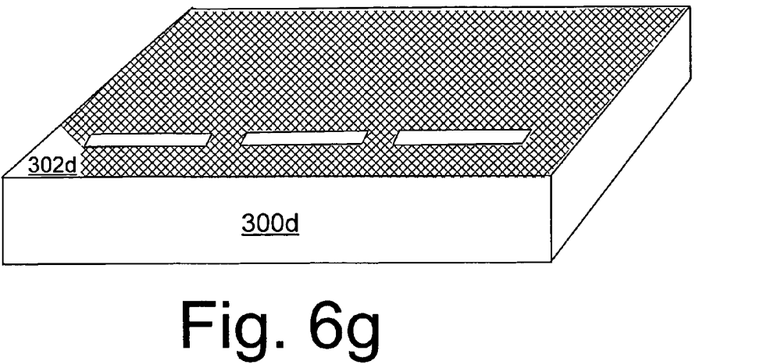
Figure 6H:
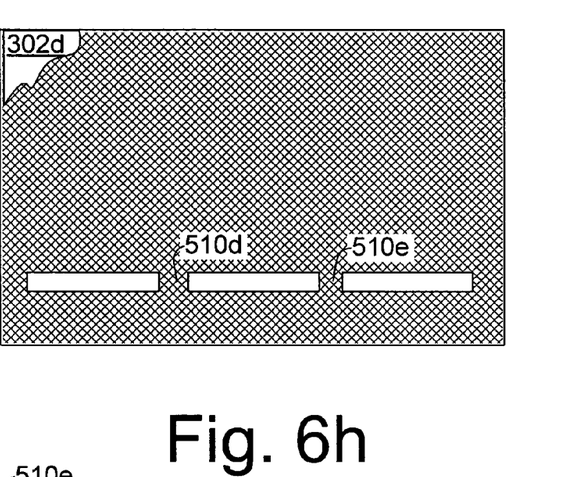
Figure 6I:
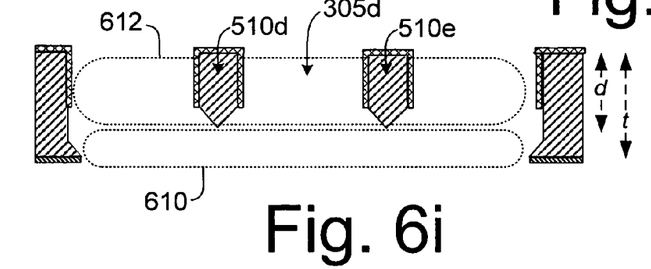
Figure 6J:
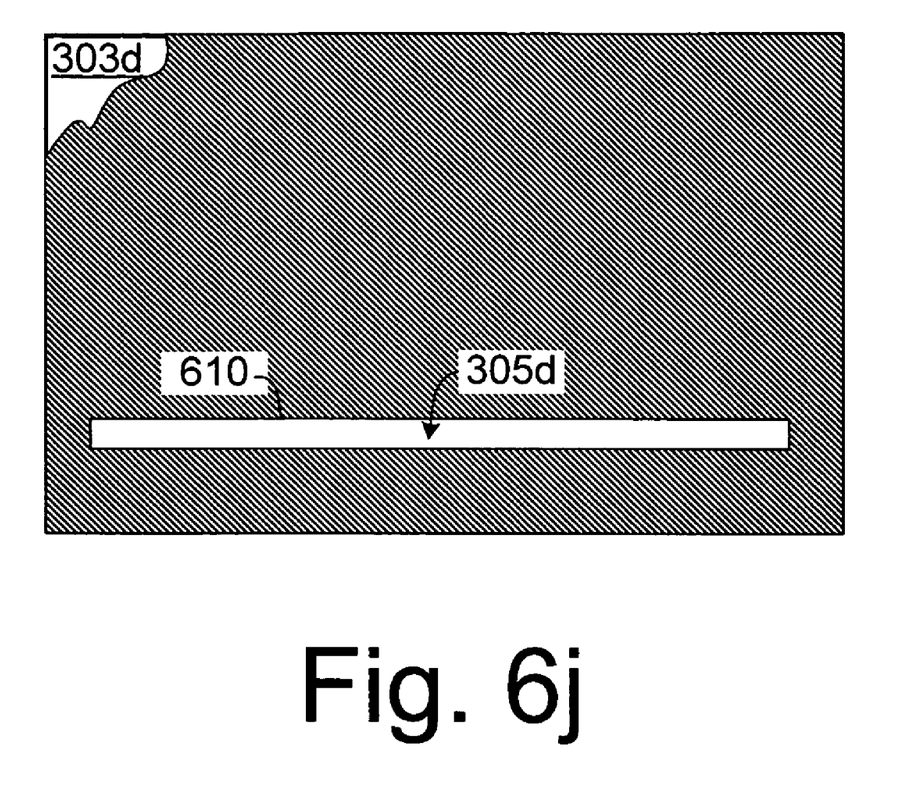

FIGS. 6a–6j illustrate still another exemplary substrate and processing steps for forming feature(s) in the substrate. FIG. 6a represents a view similar to FIG. 5a. Similarly, FIGS. 6b–6d represent views similar to those of FIGS. 5c–5e. FIGS. 6e–6f are cross-sectional representations of substrate 300d. FIGS. 6g–6i are perspective top and cross-sectional views respectively, which are similar to FIGS. 5f–5h respectively. FIG. 6j illustrates a top view similar to that illustrated in FIG. 6a.

Referring now to FIG. 6a where etch resistant material 402d is patterned over second surface 303d to form opening 404d. As described above, the opening can determine the relative size and location at the second surface of a slot formed through the substrate.

As illustrated in FIGS. 6b–6d, multiple features are formed through substrate's first surface 302d with a first substrate removal process. In this instance, three features 412d–412f are formed through first surface 302d. Substrate material 510b, 510c separates individual features. FIG. 6b represents a perspective view of substrate 300d, while FIGS. 6c–6d represent a top view and a cross-sectional view respectively. Various first substrate removal processes are described above.

Referring to FIG. 6e, second etch resistant material 420d is positioned over first surface 302d and into features 412d–412f. As illustrated in FIG. 6f a further process step removes the protective layer 420d from the features' bottom surfaces 418d–418f. Suitable processes for removing the etch resistant material are described above.

Referring now to FIGS. 6g–6j where an etchant removes additional substrate material to form slot 305d, at least in part, from features 412d–412f, illustrated in FIGS. 6b–6f.

During etching, etch resistant material 420d protects the sidewalls of the features sufficiently so that substrate material indicated generally at 510d, 510e extends across the slot. Such substrate material extending across a long axis of the slot can be referred to as ribs and can strengthen the substrate compared to a slotted substrate lacking such ribs. As should be recognized by the skilled artisan the depth d of the ribs as a percentage of the substrate's thickness t can be determined by the depth of the features formed with the first process illustrated in FIGS. 6b–6d. Alternatively or additionally the area of the ribs protected from the etch process by second etch resistant material 420d can affect the rib configuration. As can be evidenced by comparing the top view of first surface 302d illustrated in FIG. 6h with the top view of second surface 303d illustrated in FIG. 6j in conjunction with FIGS. 6g and 6i, slot 305d has a generally continuous region 610 proximate the first surface 302d and a generally discontinuous region 612 proximate first surface 302d. Such a configuration can allow ribs comprising substrate material 510d, 510e to extend across slot 305d and thus increase the strength of slotted substrate 300d, while allowing a generally uniform fluid environment at the second surface to supply various structures such as chambers 324 described above in relation to FIG. 3.

The embodiments described above relate to through features, but alternatively or additionally exemplary process steps can be utilized to produce exemplary blind features. FIGS. 7a–7d illustrate one such process and resultant feature.

Figure 7A:
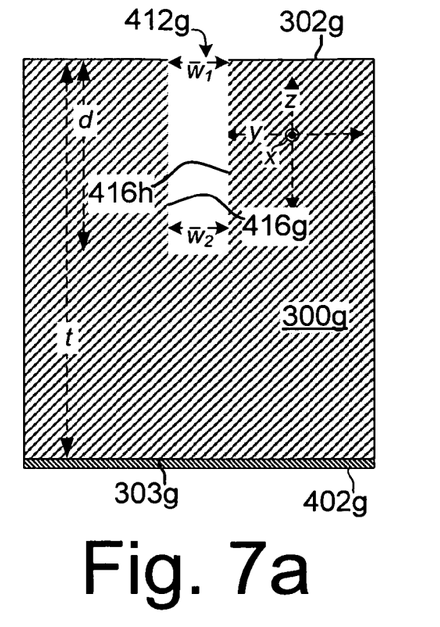
FIGS. 7a–7d illustrate diagrammatic representations of process steps for forming an exemplary substrate in accordance with one embodiment.

FIG. 7a illustrates a blind feature 412g formed in first surface 302g of substrate 300g with a first substrate removal process. A first etch resistant material 402g is positioned over second surface 303g. In this particular implementation, blind feature 412g extends to a depth d comprising about one-half of the substrate's thickness t. Other implementations can form the blind feature to greater or lesser depths. Blind feature 412g can be defined, at least in part, by a first width $w_1$ proximate first surface 302g which is greater than or equal to a second width $w_2$ which is distal the first surface relative to width $w_1$. Widths $w_1$ and $w_2$ are measured along an axis of the substrate and parallel the first surface. In this instance, the first and second widths are defined by first and second sidewalls 416g, 416h which in this embodiment are generally orthogonal to first surface 302g.

Figure 7B:
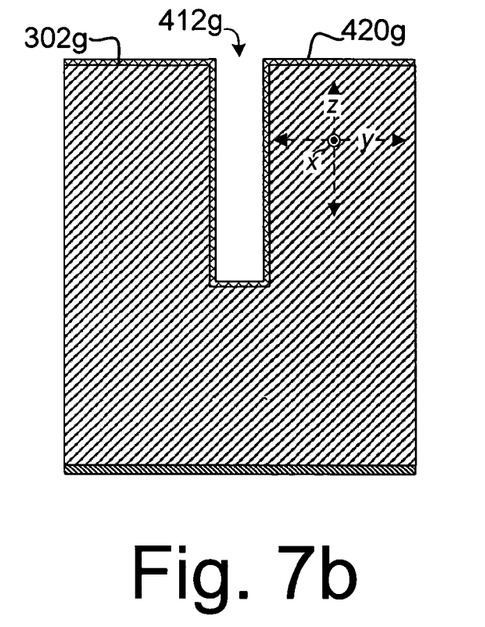

FIG. 7b illustrates a second etch resistant material 420g positioned over first surface 302g and blind feature 412g. Exemplary etch resistant materials are described above.

Figure 7C:
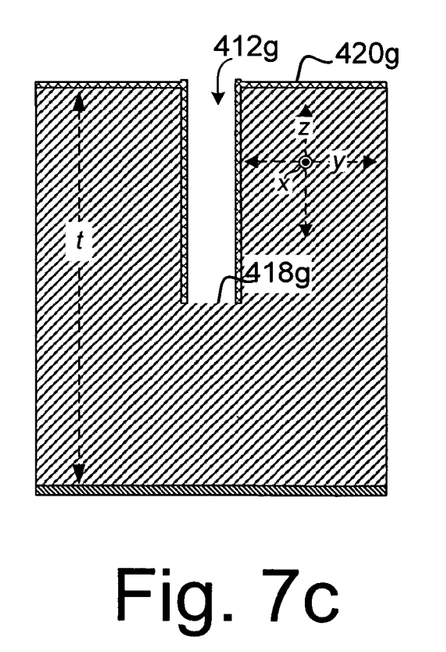

FIG. 7c illustrates a process step for removing second etch resistant material 420g from bottom surface 418g of blind feature 412g. Various suitable processes are described above.

Figure 7D:
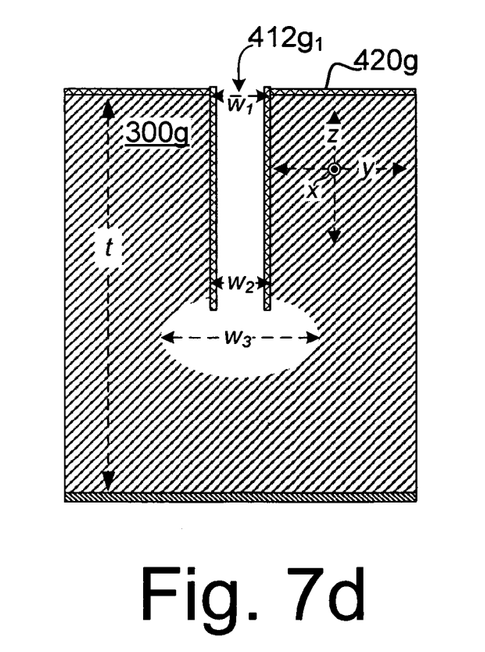

FIG. 7d illustrates a further process step exposing substrate 300g to an etchant sufficient to remove additional substrate material to form blind feature $412g_1$. In this instance an etchant such as a mixture of nitric acid, hydrofluoric acid, and Acidic Acid can be utilized among others. Etching causes blind feature $412g_1$ to have a third width $W_3$ more distal the first surface than first and second widths $w_1$, $W_2$ and which is greater than the first and second widths. Second etch resistant material 420g can be removed from additional portions of blind feature $412g_1$ in subsequent process steps utilizing known techniques or can be left in the blind feature. Blind feature $412g_1$ as illustrated in FIG. 7d can be utilized in many diverse applications. For example such application may include, incubators for miniature bioreactors, assay pockets for bodily fluid medical assays including DNA tests as well as various microelectromechanical devices.

The process steps described above can allow various substrate removal techniques to be combined to form a feature through a substrate. Some embodiments can form multiple blind features with a first substrate removal process and can remove additional substrate material by etching the substrate. Etching to form a through feature, such as a slot, can allow the slot to be positioned as desired at a surface of the substrate. Further, due to the selective nature of the etching process, substrate material can be removed without damaging other proximately positioned materials such as thin film structures. Some embodiments further control where etching occurs by positioning an etch resistant material over surfaces defining the features.

Although specific structural features and methodological steps are described, it is to be understood that the inventive concepts defined in the appended claims are not necessarily limited to the specific features or steps described. Rather, the specific features and steps are disclosed as forms of implementation of the inventive concepts.

What is claimed is:

1. A method comprising:
   forming a blind feature through a majority of a thickness of a substrate, the blind feature being defined by at least one sidewall surface and a bottom surface;
   applying a wet etch resistant material to the blind feature;
   removing the wet etch resistant material from at least a portion of the bottom surface; and
   wet etching the substrate at least through the bottom surface sufficient to form a through feature through the thickness of the substrate.

2. The method of claim 1, wherein forming comprises forming the blind feature through a first surface of the substrate such that the at least one sidewall surface extends generally orthogonally to the first surface.

3. The method of claim 1, wherein forming comprises laser machining, directional dry etching, reactive ion etching, or a combination thereof.

4. The method of claim 1, wherein applying comprises depositing the wet etch resistant material via one or more of chemical vapor deposition, plasma enhanced chemical vapor deposition, ionized deposition, plating, or physical vapor deposition.

5. The method of claim 1, wherein removing comprises laser machining, directional dry etching, ion milling, reactive ion etching, sawing, or a combination of thereof.

6. The method of claim 1, wherein wet etching comprises immersing the substrate in a wet etchant.

7. The method of claim 1, wherein forming comprises forming the blind feature into a first surface of the substrate and wherein wet etching comprises removing substrate material from the bottom surface and removing substrate material from a second surface of the substrate which generally opposes the first surface.

8. The method of claim 7, wherein applying the wet etch resistant material comprises patterning the wet etch resistant material over the second surface.

9. The method of claim 8, wherein wet etching aligns the through feature at the second surface with the patterned areas of the wet etch resistant material.

10. The method of claim 1, wherein forming comprises forming the blind feature being defined by a first sidewall surface and a generally parallel second sidewall surface spaced from the first sidewall surface by a width, and wherein said wet etching does not affect the width.

11. A print head formed in accordance with the method of claim 1.

12. A method comprising:
forming a blind feature through a first surface of a substrate, the blind feature being defined, at least in part, by first and second sidewalls and a bottom surface; and
removing additional substrate material through the bottom surface sufficient to form a maximum width of the blind feature without substantially affecting a minimum width defined between the first and second sidewalls.

13. The method of claim 12, wherein the removing comprises wet etching.

14. The method of claim 12, wherein the forming comprises forming a blind feature having generally parallel first and second sidewalls.

15. A through feature forming method comprising:
forming a plurality of blind features into a first surface of a substrate; and
wet etching the substrate sufficiently to connect the blind features to form a slot through the substrate.

16. The method of claim 15, wherein said forming comprises forming the plurality of blind features in a generally linear arrangement.

17. The method of claim 15, wherein said forming comprises forming the plurality of blind features through at least a majority of a thickness of the substrate as defined by the first surface and a generally opposing second surface.

18. The method of claim 17, wherein said forming comprises forming the plurality of blind features to a first depth which is less than the thickness and wherein said wet etching extends the blind features to a second depth which equals the thickness.

19. The method of claim 15, wherein said wet etching removes substrate material such that at least a portion of the slot is generally continuous in any cross-sectional view taken parallel to the first surface.

20. The method of claim 15, wherein said forming comprises forming the blind features to a first depth that is less than a thickness of the substrate as measured between the first surface and a generally opposing second surface and wherein individual blind features are defined by at least one sidewall surface and a bottom surface, and further comprising applying an etch resistant layer to the blind features.

21. The method of claim 20 further comprising, after said applying and prior to said wet etching, removing the etch resistant material from the bottom surface of individual blind features.

22. The method of claim 21, wherein said removing extends individual blind features to a second greater depth that is at least about 75 percent of the thickness.

23. A microdevice substrate comprising:
at least one feature extending between a first substrate surface and a second substrate surface; and
the at least one feature being defined, at least in part, by at least one pair of generally opposing co-tapering spaced apart constriction structures.

24. The microdevice substrate of claim 23, wherein each constriction structure comprises one or more faceted surfaces.

25. The microdevice substrate of claim 23, wherein the feature is generally elongate.

26. The microdevice substrate of claim 23, wherein the feature comprises a slot.

27. A microdevice substrate comprising:
at least one blind feature extending through a first substrate surface; and
the at least one blind feature being defined, at least in part, by a first a second and a third width measured parallel the first surface where the first width is proximate the first surface and the second width is less than or equal to the first width and is interposed between the first width and the third width, and wherein the third width is greater than the second width.

* * * * *